United States Patent
Dally et al.

(10) Patent No.: US 6,861,916 B2
(45) Date of Patent: Mar. 1, 2005

(54) PHASE CONTROLLED OSCILLATOR CIRCUIT WITH INPUT SIGNAL COUPLER

(75) Inventors: William J. Dally, Stanford, CA (US); Ramin Farjad-Rad, Mountain View, CA (US); John W. Poulton, Chapel Hill, NC (US); Thomas H. Greer, III, Chapel Hill, NC (US); Hiok-Tiaq Ng, Redwood City, CA (US); Teva J. Stone, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/615,819

(22) Filed: Jul. 9, 2003

(65) Prior Publication Data

US 2004/0012453 A1 Jan. 22, 2004

Related U.S. Application Data

(63) Continuation of application No. 09/891,233, filed on Jun. 22, 2001, now Pat. No. 6,617,936.
(60) Provisional application No. 60/269,984, filed on Feb. 20, 2001.

(51) Int. Cl.[7] ............................ H03B 5/24; H03L 7/099
(52) U.S. Cl. ......................... 331/172; 331/34; 331/173; 331/175
(58) Field of Search ............................. 331/1 A, 2, 10, 331/17, 18, 25, 34, 57, 135, 172, 173, 175, 177 R

(56) References Cited

U.S. PATENT DOCUMENTS

| | | | |
|---|---|---|---|
| 4,355,404 A | * | 10/1982 | Uzunoglu .................. 375/332 |
| 5,563,554 A | | 10/1996 | Mizuno |
| 5,708,381 A | | 1/1998 | Higashisaka |
| 6,025,756 A | | 2/2000 | Miyabe |
| 6,317,008 B1 | | 11/2001 | Gabara |

OTHER PUBLICATIONS

Rategh, Hamid R., et al., "Superharmonic Injection Locked Oscillators as Low Power Frequency Dividers," 1998 Sympos. on VLSI Circuits Digest of Tech. Papers, pp. 132–135 (1998).

Rategh, Hamid R., et al., "Superharmonic Injection–Locked Frequency Dividers," *IEEE Journal of Solid–State Circuits*, 34(6):813–821 (Jun. 1999).

Wong, K. W., et al., "Phase Tuning Beyond 180 Degrees by Injection–Locked Oscillators, *IEEE TENCON '93/Beijing*", pp. 1–4 (1993).

Wong, K. W. et al., "*Frequency Synthesis Using Non–Integral Subharmonic* Injection Locking," *IEEE TENCON'93*, pp. 16–19 (1993).

Tokumitsu, Tsuneo, et al., A Novel Injection–Locked Oscillator MMIC with Combined Ultrawide–Band Active Combiner/Divider and Amplifiers, *IEEE Trans. on Microwave Theory and Tech.*, 42(12):2572–2578 (1994).

\* cited by examiner

*Primary Examiner*—David Mis
(74) *Attorney, Agent, or Firm*—Hamilton, Brook, Smith & Reynolds, P.C.

(57) ABSTRACT

An oscillating signal in an oscillator is caused to phase shift toward the phase of an input signal coupled to the oscillating signal. The resonant frequency of the oscillator is about equal to an integer multiple of the frequency of the input signal. The input signal may be generated in a pulse generator to have an input pulse duration less than or equal to that of the oscillating signal. The oscillator circuit may be used as a filter to filter pulse width variations or to filter jitter from a reference clock. The oscillator circuit may also serve as a buffer by amplifying the input signal. Phase interpolation can be obtained by coupling at least one input signal with at least one oscillating signal.

94 Claims, 15 Drawing Sheets

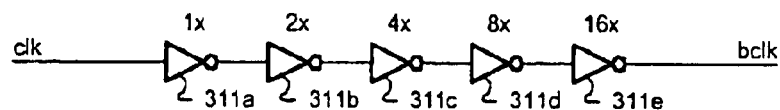
Figure 23 - Prior Art
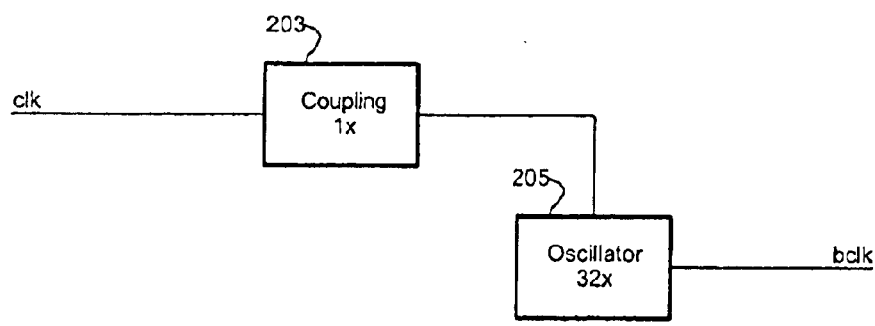
Figure 24
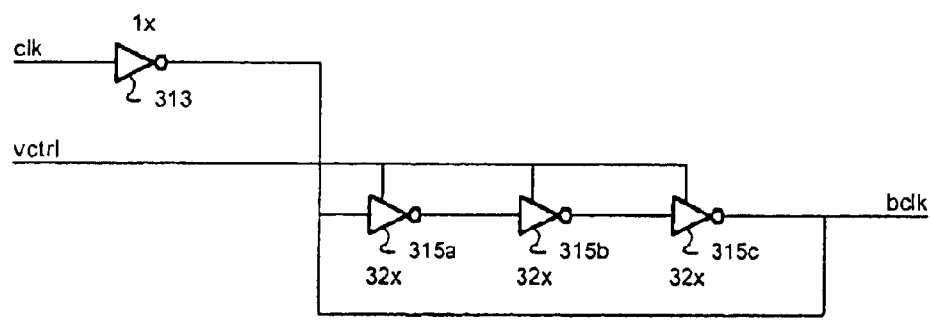
Figure 25

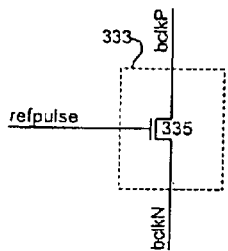
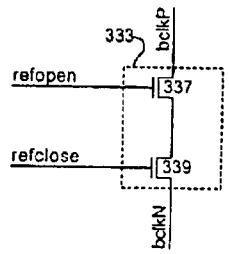
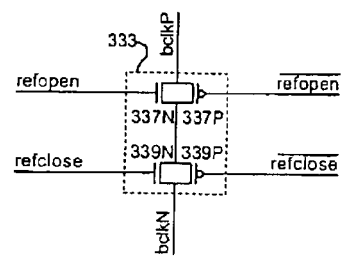
Figure 29     Figure 30     Figure 31
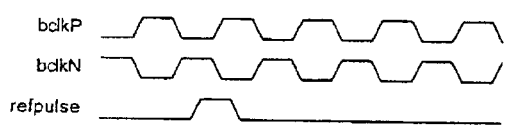
Figure 32
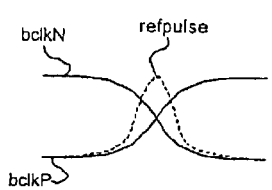
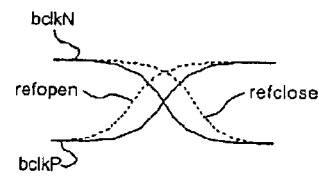
Figure 33     Figure 34
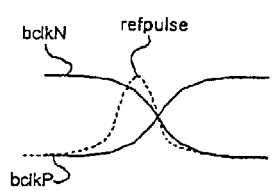
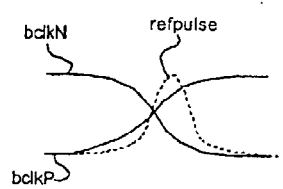
Figure 35     Figure 36

PHASE CONTROLLED OSCILLATOR CIRCUIT WITH INPUT SIGNAL COUPLER

RELATED APPLICATIONS

This application is a continuation of U.S. application Ser. No. 09/891,233, filed Jun. 22, 2001, now U.S. Pat. No. 6,617,936, which claims the benefit of U.S. Provisional Application No. 60/269,984, filed on Feb. 20, 2001. The entire teachings of the above applications are incorporated herein by reference.

BACKGROUND OF THE INVENTION

Communication circuits use clock multipliers to convert a lower frequency reference clock, rclk, to a higher frequency bit clock, bclk. For example, the preferred embodiment uses a clock multiplier to convert a 156 MHz reference clock to a 1.248 GHz bit clock, a multiplication factor of eight. As described in pending patent application Ser. No. 09/557,640, filed Apr. 25, 2000, prior art communication systems have employed phase-locked loops (PLLs) and delay-locked loops (DLLs) to perform clock multiplication. PLL clock multipliers suffer from increased jitter because they integrate phase error over many reference clock cycles, and DLL-based clock multipliers introduce jitter due to device mismatch. The above referenced application shows how a multiplying-DLL-based clock multiplier can be used to give low jitter by eliminating both of these effects.

SUMMARY OF THE INVENTION

The present invention relates to improvements in an oscillator circuit by which its phase is controlled and to particular applications of the improved oscillator circuit.

In accordance with one aspect of the invention, an input signal has a frequency about equal to or less than the resonant frequency of an oscillator. A coupler couples the input signals to an oscillating signal in the oscillator to cause a phase shift of the oscillating signal toward the phase of the input signal.

In certain embodiments, the resonant frequency of the oscillator is about equal to an integer multiple of the frequency of input signal. The input signal has a pulse duration less than or equal to a pulse duration of the oscillating signal. The oscillating signal may be gated by the input signal to stop the oscillator, or the coupler may provide soft phase correction in which each active edge of the input signal moves the phase of the oscillating signal only part of the distance needed to align it with the input signal. The input signal may comprise a reference clock and a delayed version of the reference clock and may be generated in a pulse generator from a reference clock.

In certain embodiments, the frequency of the input signal is about equal to the resonant frequency. The oscillator may amplify the input signal. The oscillator may filter the input signal such as to filter pulse width variations of the input signal. When combined with an input oscillator which generates the input signal from a reference clock, the oscillator circuit may filter jitter from the reference clock. The coupler may provide a filtering time constant which is greater than a cycle time of the input signal.

In phase interpolator embodiments of the invention, at least one input signal is selectively coupled with at least one oscillating signal. Injection signals of multiple phases may be selectively coupled to an oscillating signal of the oscillator, or an input signal may be selectively coupled to oscillating signals of multiple phases. The coupler may comprise N digitally adjustable resistors coupled to N oscillating signal phases. In certain embodiments, at most two resistors couple the input signal at any one time. A conductance of the resistors is varied to interpolate between phases. The resistors may, for example, comprise NFETs, segmented NFETs, transmission gates or segmented transmission gates.

In certain embodiments, a free running frequency of the oscillator is controlled by a reference delay. A free running frequency of the oscillator may be controlled by a phase comparator or a replica oscillator. The replica oscillator may be controlled by a phase locked loop or a delay locked loop.

The oscillator may be a ring oscillator and may be a differential oscillator. In certain embodiments, the ring oscillator comprises inverter delay elements. The oscillator may include plural stages such as two or three stages, and they may include source coupled stages. The oscillator may be an LC oscillator.

The coupler may comprise a partial NAND gate or a partial NOR gate. The coupler may comprise a conductance between phases of a ring oscillator. The conductance may, for example, be an FET or a transmission gate. The coupler may comprise an inverter or a resistor.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 23 illustrates a prior art buffer comprising a chain of inverters.

FIG. 24 illustrates an embodiment of clock buffering in accordance with the present invention.

FIG. 25 illustrates a specific implementation of the clock buffer of FIG. 24.

FIGS. 29, 30 and 31 illustrate different differential couplers which may be used in the embodiment of FIG. 28.

FIG. 32 illustrates timing of the circuit of FIG. 28 in lock.

FIGS. 33, 34, 35 and 36 present enlarged views of the timing of the differential signals in different modes of operation of the circuit of FIG. 28.

DETAILED DESCRIPTION OF THE INVENTION

A description of preferred embodiments of the invention follows.

Figure 1:
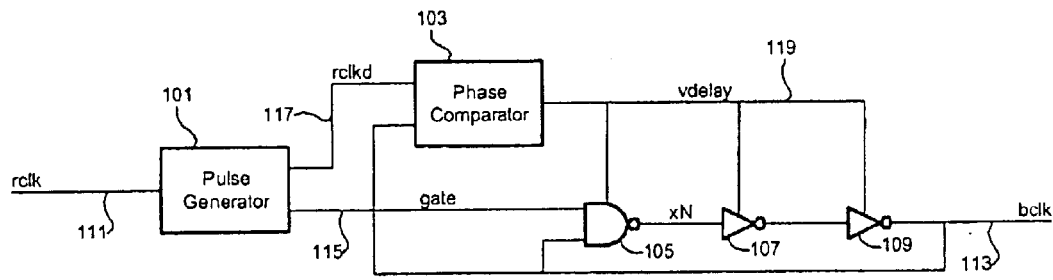
FIG. 1 shows a clock multiplier embodying the present invention.

FIG. 1 shows a clock multiplier realized using a stoppable oscillator. NAND-gate 105, and inverters 107 and 109 form a voltage-controlled ring oscillator. This oscillator free-runs, generating bclk, as long as the gate signal is high. When the gate signal is low, the oscillator is stopped with the bclk output low. The oscillator frequency is set via a control voltage, Vdelay, that is adjusted by comparing the phase of bclk to the phase of a delayed referenced clock, rclkd, in phase comparator 103. In the preferred embodiment, phase comparator 103 is realized as a combined phase comparator and charge pump as described in pending patent application Ser. No. 09/414,761, filed Oct. 7, 1999, the entire teachings of which are incorporated herein by reference.

Figure 42:
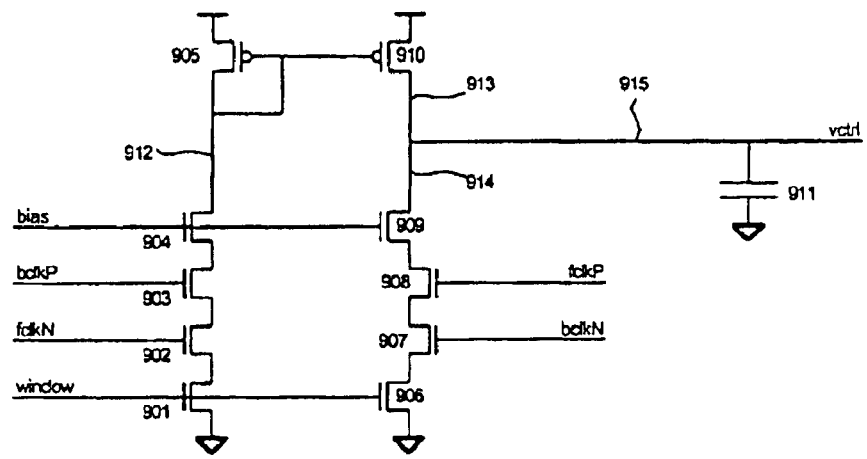
FIG. 42 illustrates a combined phase comparator and charge pump circuit for use in the embodiment of FIG. 1.

A combined phase comparator and charge pump circuit is illustrated in FIG. 42. This circuit accepts both polarities of two clocks, bclk and fclk, and a window signal that is true during the active edge of the clock signals. If bclk leads fclk while window is true, bclkP will go high while fclkN is still high and current will flow in the left stack of NMOS transistors 901–904. This current is mirrored by the PMOS current mirror 905 and 910 so that device 910 charges capacitor 911. Similarly if fclk leads bclk, current flows in the right stack of NMOS transistors 906–909 which discharges capacitor 911. Thus, the circuit acts to remove charge from 911 when fclk leads and add charge to capacitor 911 when bclk leads.

As long as the gate signal remains high, the circuit of FIG. 1 acts as a conventional phase-locked loop with clock phase adjusting the control voltage which in turn adjusts clock frequency. The addition of the gate signal to the circuit of FIG. 1 resets the phase error on each cycle of the reference clock. In doing so, it overcomes the jitter accumulation problem of prior-art PLL clock multipliers.

Figure 2:
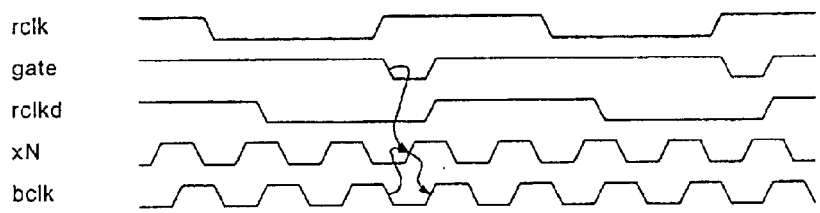
FIGS. 2, 3 and 4 are timing diagrams illustrating different modes of operation of the circuit of FIG. 1.
Figure 3:
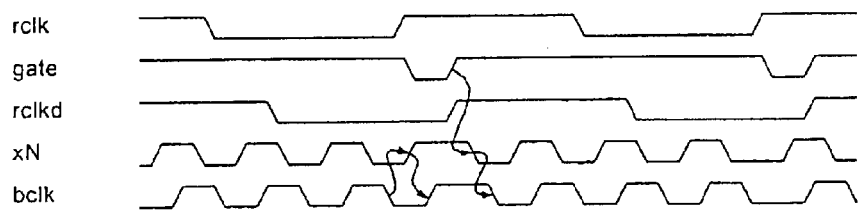
Figure 4:
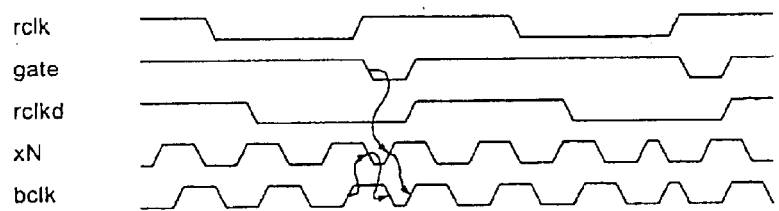

The reset of phase error using the gate signal is illustrated in FIGS. 2 through 4. FIG. 2 shows the case where bclk is locked in phase with rclkd. In this case, the gate pulse is low during the same period that bclk is low and hence does not affect the timing of bclk. The oscillator runs freely when in lock. Each edge of bclk occurs $t_d$ after the preceding edge where $t_d$ is the delay of the ring-oscillator delay line. Because gate rises and falls at exactly the same time as bclk, it does not alter this timing.

FIG. 3 shows the case where bclk is fast. In this case, bclk rises while gate is still low. This causes the output xN of NAND 105 to remain high until gate rises. The result is that the high period of bclk is extended by the delay from bclk rising to gate rising. The dependency of the falling edge of bclk on the rising edge of gate is denoted by arrows in the figure. In effect, this zeros the phase error by aligning bclk with rclkd which has the same timing as gate.

FIG. 4 illustrates the case where bclk is slow. In this case, gate falls before bclk falls, causing xN to rise. This results in the output of the delay line rising $t_d$ after gate falls, earlier than it would in response to bclk. This dependency is denoted by arrows in the figure. The result is that the low period of bclk is shortened. Again the net result is that bclk is aligned with rclkd.

FIGS. 2 through 4 show the width of the low-going gate pulse being equal to the low period of bclk. A matched pulse width is easy to achieve by using a circuit identical to the ring-oscillator delay in pulse generator 101. However, in some cases it is advantageous to generate a gate pulse that is shorter than the low period of bclk by using a shorter delay in pulse generator 101. A shorter gate pulse creates a dead band in the phase resetting action of the circuit. That is, it allows the ring oscillator to free run as long as its phase remains within a window of $+/-t_d-t_p$ where $t_p$ is the width of the gate pulse. In this case the phase resetting action of the gate pulse only occurs when the phase wanders outside of this window, and when the phase is reset it is reset to the closest edge of the window. Creating a dead band in the phase resetting action in this manner is advantageous in that it avoids distorting the pulse width of the clock multiplier as long as the oscillator phase remains within the window.

In practice, the action of the gate pulse is soft near the edge of the window. That is, the edge controlling the output of the NAND gate does not switch abruptly from bclk to gate, but rather the control is slowly transferred from one edge to another. This is because inputs have finite transition times and the delay of the NAND gate from one input depends on the state of the other input. For example, as the rising edge of bclk approaches the rising edge of gate the delay of the NAND gate is reduced. This soft control of the gate pulse, in combination with a narrowed gate pulse, is advantageous in that it gives a smooth transition from free-running operation of the oscillator to phase resetting operation.

While the gate pulse acts to instantaneously reset the phase of the clock multiplier of FIG. 1, the frequency of the ring oscillator is adjusted by phase comparator 103 via the control voltage Vdelay. On each reference clock cycle, the phase comparator compares the phase of bclk with the phase of the delayed reference clock, rclkd. If the rising edge of bclk leads the rising edge of rclkd, bclk is too fast. In this case the comparator acts to reduce Vdelay to slow bclk. Similarly if rclkd rises before bclk, then bclk is too slow and Vdelay is increased to speed bclk.

Although the circuit of FIG. 1 is similar to a PLL, it can be safely controlled using a simple combined phase comparator and charge pump as described in pending patent application Ser. No. 09/414,761, filed Oct. 7, 1999, the entire teachings of which are incorporated herein by reference, which has only a single pole in its transfer function. The stabilizing zero which would normally be needed to control a PLL is not needed. The phase resetting action of the gate pulse in effect acts as a stabilizing zero on the dynamics of the control loop.

Figure 5:
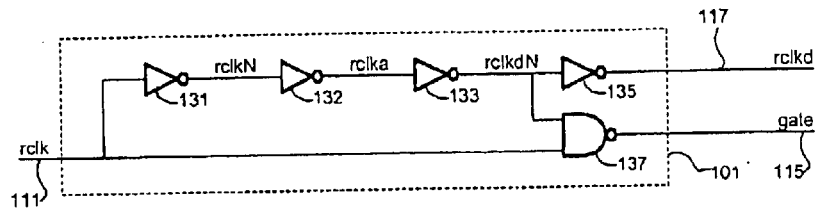
FIG. 5 illustrates details of a pulse generator used in the embodiment of FIG. 1.
Figure 37:
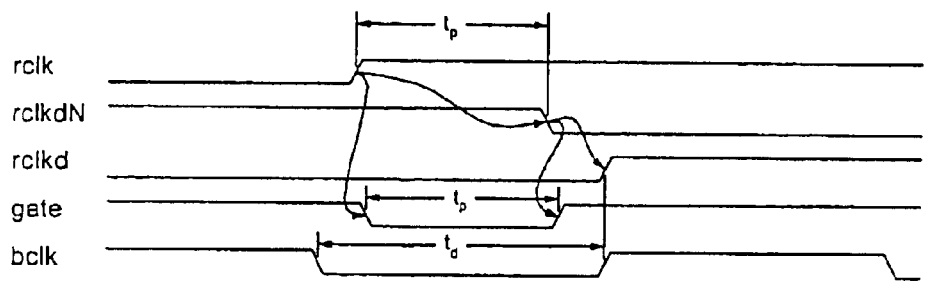
FIG. 37 is a timing diagram illustrating operation of the pulse generator of FIG. 5.

FIG. 5 shows the details of pulse generator 101. As illustrated in the timing diagram of FIG. 37, when rclk goes high, it causes gate to go low via NAND 137. After the delay of inverters 131–133, $t_p$, rclkdN goes low causing gate to return high via NAND 137 and rclkd to rise via inverter 135. The width of the gate pulse is adjusted by controlling the delay of inverters 131–133. In the preferred embodiment these inverters operate off of the ring-oscillator control voltage Vdelay so that their delay tracks the delay of the ring oscillator independent of process. The delay of inverter 135 is adjusted to set the phase of rclkd relative to the rising edge of the gate pulse. In the preferred embodiment, the pulse width $t_p$ is adjusted to be smaller than the bclk low period $t_d$ and the delay of inverter 135 is adjusted so that rclkd rises $0.5(t_d-t_p)$ after gate rises. This delay of rclkd acts to center the gate pulse on the bclk low period when the rising edges of rclkd and bclk are in phase.

Figure 6:
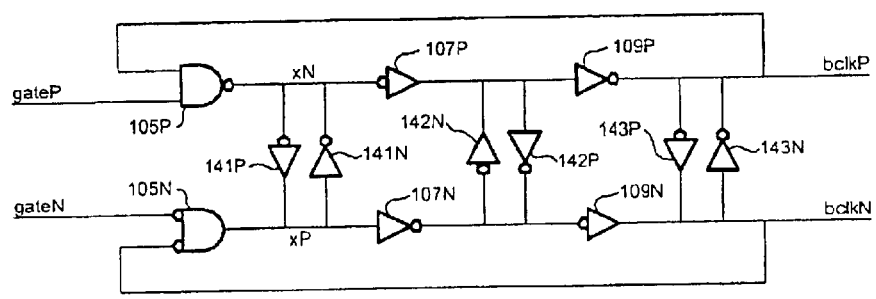
FIG. 6 illustrates a differential oscillator for use in the embodiment of FIG. 1.

In one embodiment, the gated ring oscillator, gates 105, 107, and 109 in FIG. 1, is realized as a differential CMOS oscillator as shown in FIG. 6. In this realization, each signal is replaced by a pair of signals, one that is high-true, denoted with a P suffix, and one that is low-true, denoted with an N suffix. For example, the bclk signal is replaced by high true bclkP and low true bclkN. To generate these complementary signals, each gate in the ring oscillator of FIG. 1 is replaced by a pair of complementary gates in FIG. 6. NAND 105 is realized by NAND 105P and NOR 105N. Similarly, inverters 107 and 109 are replaced by inverters 107P, 107N, 109P, and 109N. In effect, FIG. 6 shows a pair of ring oscillators: a high-true oscillator comprising gates 105P, 107P, and 109P, and a low-true oscillator comprising gates 105N, 107N, and 109N. To keep these complementary oscillators in phase, three pairs of cross-coupling inverters 141P–143P, and 141N–143N couple complementary nodes of the two oscillators.

Implementing the ring oscillator in a differential manner has two main advantages. First, it provides complementary phases of bclk that are exactly in phase. Second, it provides a degree of noise rejection.

Figure 7:
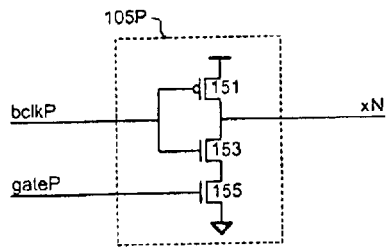
FIGS. 7, 8, 9, 10, 11, 12 and 13 illustrate different implementations of the coupling gate circuits of FIG. 6.
Figure 8:
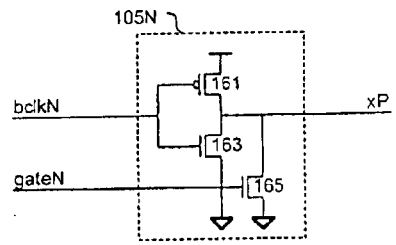

To maximize the performance of the differential ring-oscillator of FIG. 6, gates 105P and 105N can be realized with the circuits shown in FIGS. 7 and 8 respectively. FIG. 7 shows a partial NAND gate in which the output, xN, will go low only when both bclkP and gateP are high, but the output will go high whenever bclkP is low regardless of the state of gateP. There is no change in output with a change in input to bclkP high and gateP low; the prior output state is retained. As a result, a gated oscillator using this circuit will stretch the high period of the bclk pulse when bclk is fast, as shown in FIG. 3, but will not compress the low period of bclk when bclk is slow, as shown in FIG. 4.

Similarly, FIG. 8 shows a partial NOR gate in which the output, xP, will go low when bclkN is high and will go high whenever bclkN goes low. Transistor 165 tends to pull xP low when gateN is high, but the devices 161 and 165 are ratioed such that device 161 overcomes device 165 when bclkN is low, pulling xP high. The result is that, with transistor 165 turned on by gateN, the transition to xP high is slowed. This gate complements the action of the partial NAND of FIG. 7 in that it compresses the low period of bclk when bclk is slow, as shown in FIG. 4, but will not stretch the high period of bclk when bclk is fast, as shown in FIG. 3. Thus, a differential ring oscillator, such as that shown in FIG. 6, that employs the partial NAND of FIG. 7 in place of gate 105P and the partial NOR of FIG. 8 in place of gate 105N will be able to reset the phase in either case. Partial gate 105P handles the case where bclk is fast, while partial gate 105N handles the case where bclk is slow. Cross-coupling gates 141P–143P and 141N–143N ensure that a correction made to one side of the oscillator also affects the other side.

There are two advantages of using partial NAND and NOR gates. First, it is easier to implement these partial gates that make heavy use of fast NFETs and sparse use of slow PFETs. Second, and more importantly, these partial gates give a soft control over the phase of the oscillator which avoids abrupt transitions in phase.

Figure 38:
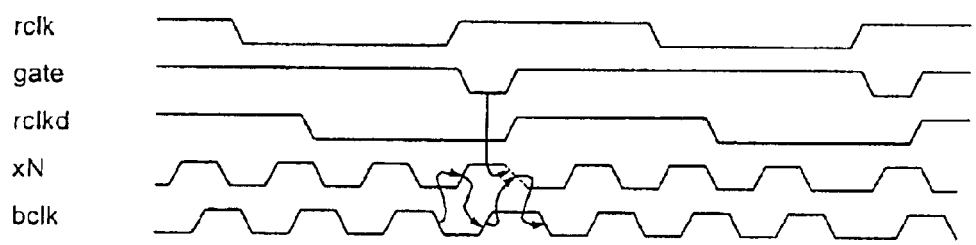
FIG. 38 is a timing diagram illustrating operation of the circuit of FIG. 9.

In some cases it is desirable to soften the phase resetting action of the gated oscillator so that the phase is not zeroed in a single reference clock (rclk) cycle, but rather averaged over several cycles. One method of achieving this softening is to replace the partial NAND gate of FIG. 7 with the circuit of FIG. 9. Rather than fully gating bcklP to disable the falling edge of xN when gateP is low, this circuit slows the transition of xN as illustrated by the broken line of FIG. 38. The circuit of FIG. 9 augments the partial NAND of FIG. 7 by adding pull-down device 157. This makes the circuit logically an inverter. When bclkP goes high, output xN will fall regardless of the state of gateP. However, the speed of this transition, and hence the resulting phase of the oscillator, depends on the state of gateP. The transition happens faster when gateP is high, since devices 153 and 155 pull down in parallel with 157. When gateP is low, the transition is slowed since device 157 supplies the pulldown current by itself. Slowing the transition in this manner stretches the high period of bclk as shown in FIG. 3, but by a smaller amount than if the circuit of FIG. 7 is used.

By setting the relative sizes of devices 157, 153, and 155, one skilled in the art can adjust the strength of the phase adjustment. If device 157 is made very small compared to the series combination of 153 and 155, the phase adjustment will be very strong—tending toward a complete reset when device 157 is removed entirely. On the other hand, if device 157 is made large compared to the series combination of 153 and 155, the phase adjustment will be very soft, with the pulse stretched by only a small amount on each reference clock cycle.

One skilled in the art will understand that the partial NOR gate of FIG. 8 can also be made to give a soft phase adjustment with a slow bclk by adjusting the relative sizes of FETs 161, 163, and 165. If FET 165 is made very large, then the phase adjustment will be hard. As FET 165 is made smaller relative to 161 and 163, the phase adjustment becomes soft.

At very high frequencies it can be problematic to generate the narrow voltage pulse needed for the gateP and gateN signals. The need to generate this pulse can be eliminated by using the circuit of FIG. 10 in place of the partial NAND gate of FIG. 7. This circuit replaces FET 155 which is driven by the gateP signal with the parallel combination of devices 155A and 155B which are driven by rclkN and rclkd respectively. On each rising edge of rclk, rclkN falls immediately turning off FET 155A. After a delay set by pulse generator 101, rclkd rises turning on FET 155B. Thus, the parallel combination of FETs 155A and 155B is off for a period of time from the falling edge of rclkN to the rising edge of rclkd, the same period of time that the single FET 155 in FIG. 7 is gated off by the low going gateP pulse.

Figure 9:
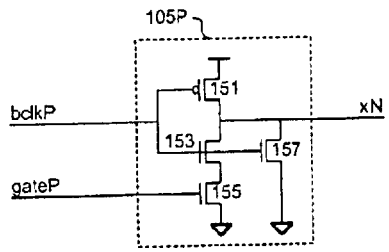
Figure 10:
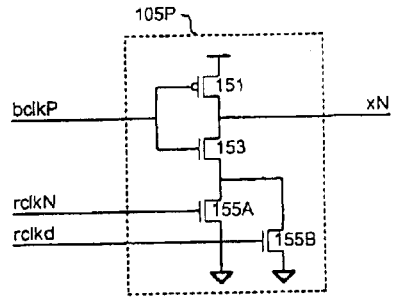
Figure 11:
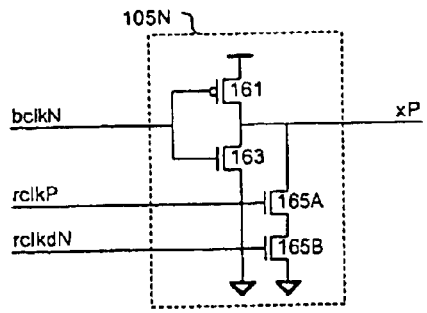

One skilled in the art will understand that the circuit of FIG. 10 can be augmented to give a soft reset by adding a parallel device 157 from xN to ground as in FIG. 9. Also, one skilled in the art will understand that the partial NOR gate of FIG. 8 can also be modified to eliminate the need for a narrow gate pulse by replacing device 165 with a series combination of devices 165A and 165B driven by rclkP and rclkdN as shown in FIG. 11. With this arrangement, the series combination of devices 165A and 165B is on from the rising edge of rclkP until the falling edge of rclkdN, the same period of time that device 165 is on in FIG. 8.

Figure 12:
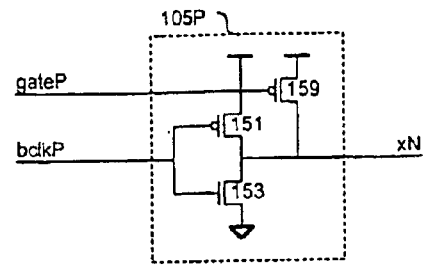
Figure 13:
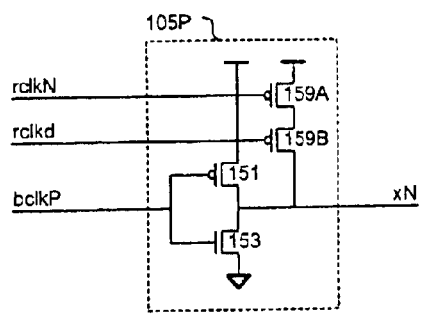

In another embodiment of the invention, partial NAND gate 105P can be implemented using the circuit shown in FIG. 12. This circuit implements the PFET side of the NAND gate by adding FET 159 from xN to Vdd gated by gateP. In this configuration the gate acts both to slow the clock when it is fast, as shown in FIG. 3, by retarding the falling edge of xN, and to speed up the clock when it is slow, as shown in FIG. 4, by accelerating the rising edge of xN. The degree of retardation or acceleration is controlled by the ratio of PFET 159 to NFET 153. One skilled in the art will understand that PFET 159 can be replaced by two series PFETs 159A and 159B gated by rclkN and rclkd as shown in FIG. 13 to avoid the need to deal with a narrow gate pulse.

Figure 14:
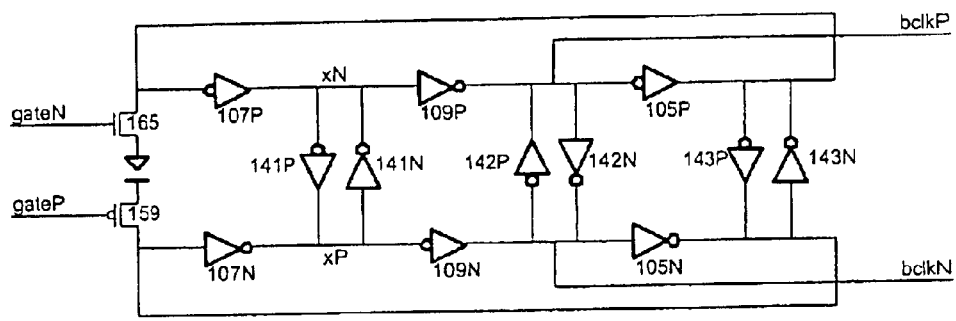
FIG. 14 shows an alternative implementation of the differential oscillator and coupling circuit.
Figure 15:
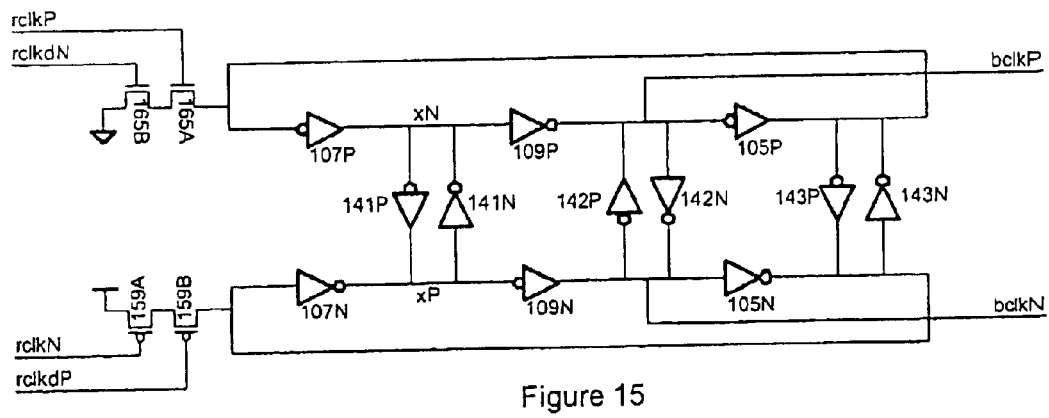
FIG. 15 illustrates another embodiment of the oscillator and coupling circuit.

If gate 105P is implemented using the circuit of FIG. 12 and gate 105N is implemented using the circuit of FIG. 8, the oscillator of FIG. 6 can be redrawn as shown in FIG. 14. Here parallel devices 159 and 165 are factored out of the partial NAND and NOR gates so that all three stages of the oscillator are implemented with identical inverters 105P and N, 107P and N, and 109P and N. To avoid the need to generate narrow gate pulses, devices 165 and 159 can be replaced with series devices 165A, 165B and 159A, 159B respectively as shown in FIG. 15. In both FIGS. 14 and 15, the supply terminals of all inverters, and of PFETs 159 and 159A are connected to the delay control voltage, Vdelay.

Clock Multiplier Using Injection-Locked Oscillator

The circuits of FIGS. 14 and 15 are really injection-locked oscillators. Inverters 105P/N through 107P/N along with cross coupled devices 141P/N through 143P/N form a free running three stage ring oscillator. The frequency of this oscillator is controlled by the control voltage, Vdelay used to supply the inverters. The phase of this oscillator, however, is controlled by injecting a pulse stream at a lower frequency via devices 165 and 159 (or 165A/B and 159A/B).

The injection-locked oscillator differs from the gated oscillator of FIG. 1 in the abruptness of the phase correction performed. The gated oscillator of FIG. 1 performs an abrupt phase correction on every pulse of the input gate signal as illustrated in FIGS. 2 through 4. After each gate pulse, the phase error is reset to zero. The injection locked oscillator of FIGS. 14 and 15, on the other hand, performs a soft phase correction. Each input pulse adjusts the phase of the oscillator with a small correction with the magnitude of the correction being proportional both to the size of devices 165 and 159 and to the magnitude of the error. This proportional phase correction results in a cleaner clock signal with lower jitter than the hard phase correction of the gated oscillator of FIG. 1.

Figure 16:
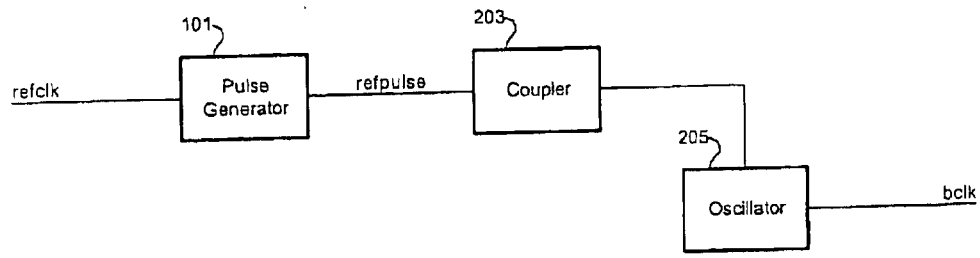
FIG. 16 presents a generalization of a clock multiplier using an injection locked oscillator.

The general arrangement of a clock multiplier using an injection-locked oscillator is shown in FIG. 16. Pulse generator 101 accepts a lower frequency reference clock, refclk, and generates a pulse, refpulse, with a width comparable to half the period of the high-speed clock, bclk. A coupler 203 couples this reference pulse into a free-running oscillator 205. One form of the coupler is a pair of FETs 165 and 159 as illustrated in FIG. 14. One skilled in the art will understand that many other forms of couplers are possible including a resistor; an inverter, buffer, or logic gate; a capacitor; or one or more transistors.

Figure 49:
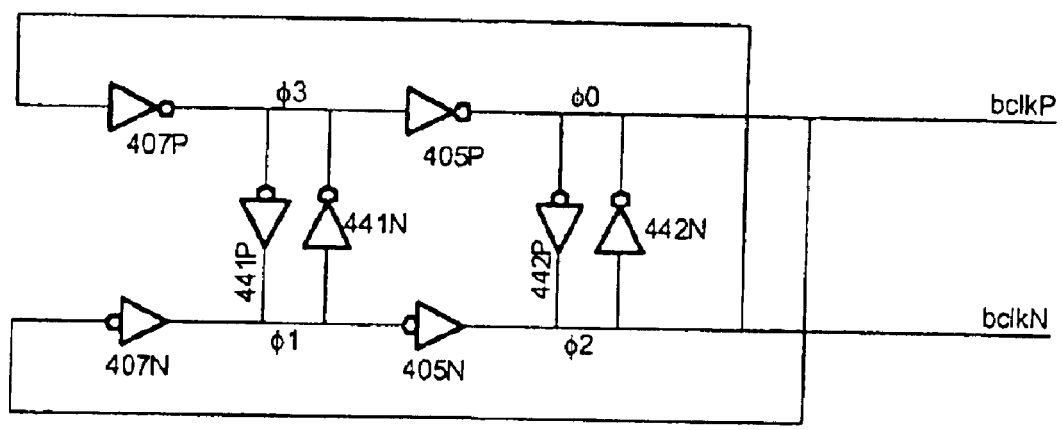
FIG. 49 illustrates a two-stage oscillator used in embodiments of the invention.

FIG. 49 illustrates a two-stage inverter ring oscillator which may replace the three-stage oscillators of FIGS. 14 and 15. Inverters 407P and 405P form a two-stage high-true oscillator, and inverters 407N and 405N form a two-stage low-true oscillator. Two pairs of cross-coupling inverters 441P, 441N and 442P, 442N couple the complementary nodes of the two oscillators.

Figure 39:
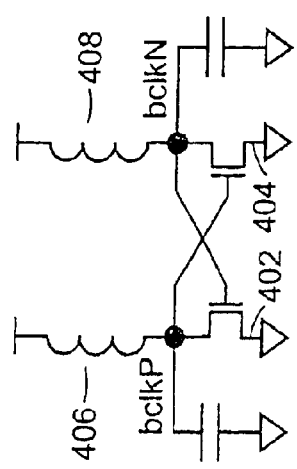
FIG. 39 illustrates an LC oscillator for use with the present invention.
Figure 40:
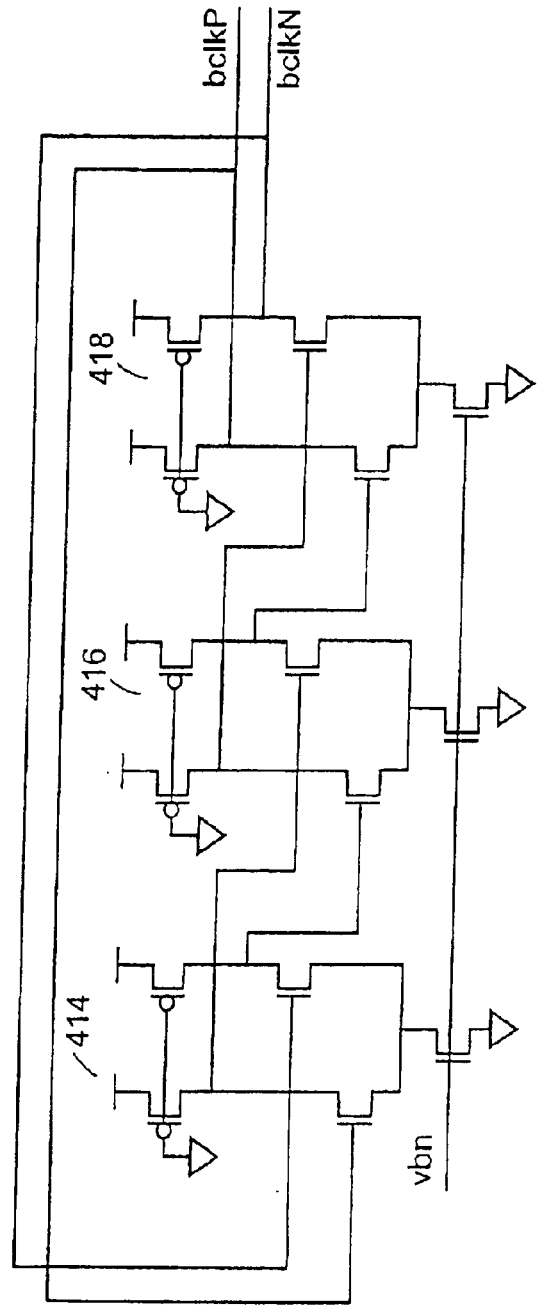
FIG. 40 illustrates a source coupled ring oscillator for use in the present invention.

The oscillator may be an inverter ring oscillator as shown in FIGS. 14, 15 and 49 or may be an LC oscillator, a source-coupled ring oscillator, or other oscillators that are known to one skilled in the art of timing circuits. For example, the oscillator in the present invention could also be an LC oscillator, as illustrated in FIG. 39, or a source-coupled ring oscillator as illustrated in FIG. 40. The LC oscillator of FIG. 39 is a differential tank circuit. A pair of cross-coupled NFETs 402, 404 adds a negative resistance across the tank to cancel the parasitic losses of the reactive elements 406, 408, 410, 412, allowing the tank to oscillate indefinitely. The source coupled ring oscillator of FIG. 40 consists of three source coupled delay element 414, 416, 418 connected in a loop with a single inversion to form a ring oscillator.

Figure 17:
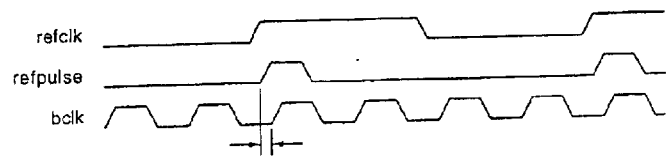
FIGS. 17 and 18 are timing charts illustrating different modes of operation of the circuit of FIG. 16.
Figure 18:
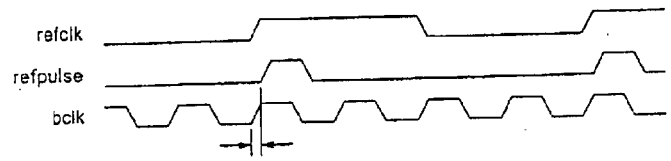

Coupler 203 phase locks the oscillator 205 to a multiple of the frequency of the reference clock, and to the exact phase of the reference pulse, as illustrated in FIGS. 17 and 18. FIG. 17 illustrates the case where the oscillator is slightly slow. In this case, the rising edge of the reference pulse leads the rising edge of the oscillator clock, bclk. As a result, the coupler acts to advance the oscillator, pulling it into frequency and phase lock. The oscillator will lock to a multiple of the reference clock frequency, in this case four times the reference clock frequency, even though the free-running frequency of the oscillator is not an exact multiple. The phase adjustments from the coupler act to pull the oscillator to the required frequency.

FIG. 18 illustrates the case where the oscillator is fast. In this case the high period of bclk leads the reference pulse. When this occurs the coupler acts to retard the falling edge of bclk slowing the oscillator and again pulling it into frequency and phase lock.

While the circuit of FIG. 16 gives an output bclk that is a multiple of the input clock refclk, the multiplication factor depends on the free-running frequency of oscillator 205. The coupler 203 acts to pull oscillator 205 into lock at the multiple of the reference clock that is the closest to the free running frequency of the oscillator. Thus, while we might desire a multiple of four times the reference clock, a slow oscillator may lock to three times the reference clock and a fast oscillator may lock to five times the reference clock.

Figure 19:
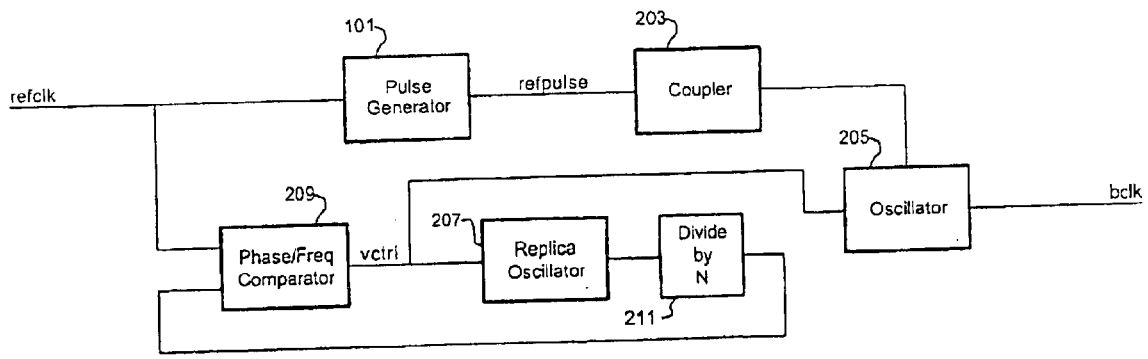
FIG. 19 illustrates an injection locked clock multiplier using a replica oscillator to control the free running frequency.

We can control the multiplication factor of the injection locked clock multiplier of FIG. 16 by augmenting the circuit with a replica oscillator 207 as shown in FIG. 19 to control the free-running frequency of oscillator 205. In this arrangement the free-running frequency of both oscillator 205 and replica oscillator 207 are controlled by a control voltage, vctrl. As is well understood by those skilled in the art, this may be the supply voltage to a ring-oscillator delay line as in FIGS. 14 and 15, a varactor control voltage for an LC oscillator, or a resistor control voltage to a source coupled ring oscillator. Oscillators 205 and 207 are identical replicas so that within process tolerances the free-running frequencies of the two oscillators at a given control voltage are identical. Oscillator 207 is connected in a conventional phase-locked loop (PLL) with divider 211 and phase/frequency comparator 209. As is well known in the art, this PLL adjusts the control voltage of oscillator 207 so that the free-running frequency of this oscillator is exactly N times the reference clock frequency. Because oscillators 207 and 205 are identical, this control voltage also adjusts the free-running frequency of oscillator 205 to be exactly N times the reference clock frequency. Thus, with this arrangement, the injection locked clock multiplier will lock to exactly N times the reference clock frequency and not N+1 or N−1 even in the presence of process, voltage, and temperature variations because the PLL acts to compensate these variations to give an oscillator 205 with an appropriate free-running frequency. For ring-oscillator based oscillators, one skilled in the art will understand that a delay-locked loop can be used in place of the phase-locked loop to control the delay and hence the free-running frequency.

With the arrangement of FIG. 19, one might ask why we do not just use the output of the replica oscillator 207 directly as our multiplied clock. While this signal has the correct frequency, it has much higher jitter than the output of the injection-locked oscillator 205. This is because the phase locked loop has a loop filter (not shown) that integrates phase error over many reference clock cycles while the injection locked loop cancels error each cycle.

Figure 20:
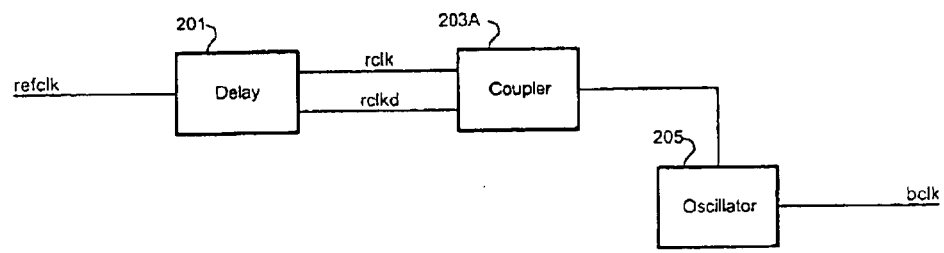
FIG. 20 illustrates an alternative to the clock multiplier of FIG. 16.

To avoid having to generate a narrow reference clock pulse, the injection-locked clock multiplier of FIG. 16 can be modified as shown in FIG. 20. Here the reference clock, refclk, is input to a delay circuit 201 that generates two versions of the reference clock, rclk and rclkd, so that rclkd lags rclk by half the period of the high-speed clock, bclk. These delayed clocks are then input to a modified coupler 203A to control oscillator 205. Coupler 203A can be realized, for example by four FETs as shown in FIG. 15 with FETs 165A/B and 159A/B.

Figure 41:
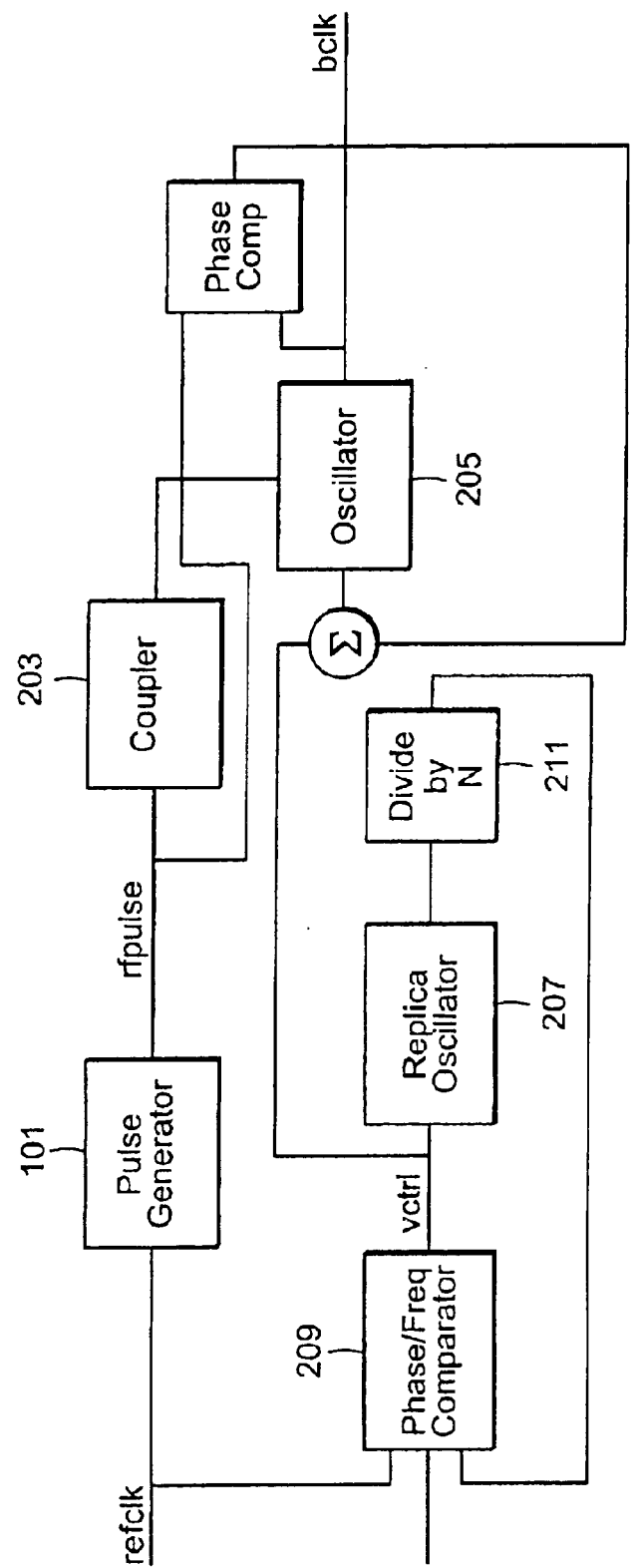
FIG. 41 illustrates an alternative to the embodiment of FIG. 19 further comprising a phase comparator.

An alternate form of the injection locked clock multiplier of FIG. 19 is shown in FIG. 41. In this embodiment, a phase comparator 450 is added to adjust vctrl at 452 so as to bring the bclk output of the oscillator into phase with the reference pulse out of the pulse generator. In operation there are three forces acting on the phase and frequency of oscillator 205. First, the replica oscillator takes over and sets vctrl to the voltage necessary for the reference oscillator to achieve lock. With appropriate matching, this guarantees that oscillator 205 is nearly at the correct frequency and is not off by a whole cycle (e.g., a divide by 9 rather than a divide by 10). Next, the phase comparator acts to fine-tune the control voltage for oscillator 205 by comparing the phase of bclk with that of the reference pulse. This fine tuning corrects for any mismatch between oscillators 205 and 207. Finally, the coupling of the reference pulses via coupler 203 acts to pull oscillator 205 into exact lock with the reference pulse.

Clock Filtering Using an Injection-Locked Oscillator

The very low jitter of the injection-locked clock multiplier described above makes it an attractive building block for timing systems even in applications where multiplication is not required. One such application is as a clock filter where the injection-locked oscillator accepts a clock, xclk, at the high frequency and outputs a clock, bclk, at the same frequency but with less jitter.

Figure 21:
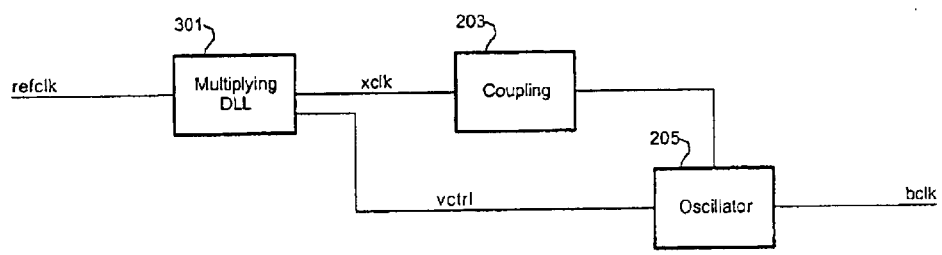
FIG. 21 illustrates the use of the oscillator as a filter.

A particular application of this clock filter is to a multiplying delay-locked loop as described in pending patent application Ser. No. 09/557,640 filed Apr. 25, 2000, the entire teachings of which are incorporated herein by reference. The general arrangement is shown in FIG. 21. Here multiplying DLL 301 accepts a reference clock, refclk, and generates a high frequency clock, xclk, at a multiple, N, of refclk. In one embodiment, the refclk frequency is 155.5 MHz and N is 8 giving a bclk frequency of 1.244 Ghz. This high-frequency clock, xclk, is coupled to oscillator 205 via coupler 203. In the embodiment oscillator 205 is an inverter ring oscillator as shown in FIG. 15 and the coupler is a pair of FETs. Also in the embodiment, the delay elements in oscillator 205 are matched to the delay elements in the ring oscillator of multiplying DLL 301 and the control voltage of the multiplying DLL is applied to oscillator 205 to set the free running frequency of the oscillator to be equal to the frequency of xclk.

Figure 22:
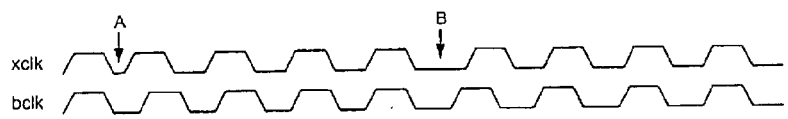
FIG. 22 illustrates the filtering action of the oscillator of FIG. 21.

The injection locked oscillator 205 acts to filter the clock from the multiplying DLL 301 to reduce pulse width variation and to partially filter jitter on the input refclk. As described in pending patent application Ser. No. 09/557,640 filed Apr. 25, 2000, the entire teachings of which are incorporated by reference, a multiplying DLL gives very low jitter compared to a PLL because it resets the phase error on each cycle of refclk. The multiplying DLL, however has two weaknesses that are corrected by filtering its output. First, any jitter on input clock, refclk, is passed directly to the output clock, xclk. Second, resetting the phase error on xclk is performed during a single cycle clock xclk. This can result in a short or long pulse on xclk as illustrated in FIG. 22. At very high frequencies, this pulse width variation is amplified by downstream circuitry causing jitter and, in extreme cases, possible loss of a clock pulse.

FIG. 22 illustrates the filtering action of the injection-locked oscillator. Before point A, clocks xclk and bclk are in phase. At point A the phase of xclk is reset. This results in a narrow low going pulse on xclk and causes it to lead bclk. Coupler 203 acts to gradually adjust the phase of bclk to track this abrupt change in the effect of xclk. The strength of the coupler is adjusted so that the phase of bclk 'catches up' with the phase of xclk before the next adjustment of xclk. In the figure, this adjustment is spread across four cycles, and in another embodiment the adjustment is spread across eight cycles. The process is repeated at point B except that in this case the phase of xclk is retarded, resulting in a stretched low going pulse. As at point A, the coupler acts to gradually bring bclk back in phase with xclk over the next N cycles.

The coupler and injection-locked oscillator in effect act as a low-pass filter on the phase of xclk acting to smooth out the abrupt phase adjustments of the multiplying delay-locked loop. The net result is an output clock bclk, that has the same low jitter as the multiplying DLL, since it completely corrects the phase error each cycle of refclk, but with much smaller output pulse width variation. Because the phase adjustment is spread over N cycles rather than occurring all in a single cycle, the pulse width variation is reduced by approximately a factor of N.

The low-pass filtering of phase error performed by the coupling of the multiplying DLL to the injection-locked oscillator of FIG. 21 also acts to partially filter jitter on the input clock. Input clock jitter passes directly through the multiplying DLL since every $N^{th}$ clock is derived directly from the input clock. If there is jitter on the input clock, the clock edge corresponding to the input clock may be slightly early or slightly late leading to a narrow or wide clock pulse out of the multiplying DLL. As described above, by setting the strength of the coupling between the multiplying DLL and the injection-locked oscillator, the pulse width variation can be minimized by spreading the phase variation out over N cycles. If the strength of the coupling is reduced even further, so that it takes more than N cycles to converge, the input jitter will be filtered. The phase of the injection locked oscillator will not have time to converge to the phase of the multiplying DLL after each input clock edge. Instead, the injection-locked oscillator will track the average phase of the last several input pulses, in effect filtering the jitter of the input clock.

In setting the strength of the coupling from the multiplying DLL to the injection-locked oscillator, one skilled in the art will understand that making the coupling weaker increases the time constant of the low-pass phase filter. This filters out more input clock jitter but at the expense of not rejecting internally generated jitter. The optimal time constant is one for which these two components of jitter are approximately equal. In one embodiment, the coupling time constant is set to be equal to approximately four reference clock cycles.

Figure 43:
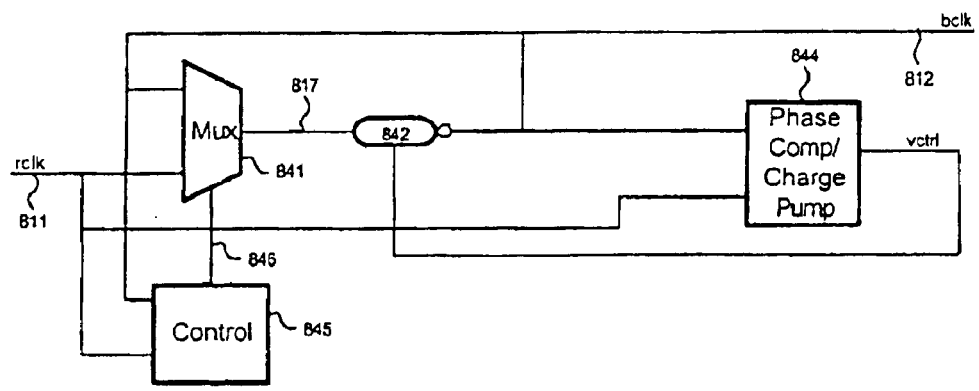
FIG. 43 illustrates a multiplying delay locked loop for use in the embodiment of FIG. 21.

A multiplying delay locked loop is shown in FIG. 43. Control block 845 initially selects the lower input of multiplexer 841 so that a rising edge on reference clock, rclk 811, propagates to node 817. The control then switches multiplexer 841 to select the upper input and the edge just passed to node 817 circulates in the ring oscillator formed by delay element 842 and multiplexer 841. After N−1 pulses have been generated by the ring oscillator, control circuit 845 again switches the multiplexer to select the rclk input so that the rising edge of every Nth pulse is caused by the rising edge of rclk. The next N−1 rising edges are caused by this edge recirculating around the ring oscillator. The position of the rising edge of rclk is compared to the rising edge of the ring oscillator output, bclk, by combined phase comparator and charge pump 844. This phase comparator and charge pump is of the form shown in FIG. 42. Signal 846, the multiplexer control, which identifies the rising edge of rclk, also acts as a window signal for the combined phase comparator and charge pump 844. The combined phase comparator and charge pump controls control voltage vctrl which in turn varies the delay of delay element 842 to bring bclk and rclk into phase. If bclk leads rclk, the comparator decreases vctrl, slowing bclk to approach the phase of rclk. Similarly, if rclk leads bclk, the comparator increases vctrl, speeding up bclk to approach the phase or rclk.

Clock Buffering Using an Injection Locked Oscillator

Another application of the injection-locked oscillator design described above is as a high fanout clock buffer. Often in digital systems a clock must be buffered (amplified) to drive a high capacitive load. The conventional approach to buffering is to use a chain of inverters of exponentially increasing size, sometimes called an exponential horn. Such an arrangement is illustrated in FIG. 23. The chain begins by passing input clock, clk, to inverter 311a which is of unit size (denoted by 1×). Each of the subsequent inverters 311b through 311e in the chain is twice the size of the preceding inverter, providing current or charge amplification without changing output voltage levels. Such a small amplification factor is typical of very high bandwidth clock buffers where the fanout of each inverter must be kept small (2 or less) to keep the inverter bandwidth high enough to pass a narrow clock pulse. The final inverter in the amplifying chain, 311e is sixteen times unit size (16×) which is large enough to drive the high capacitive load on line bclk. One skilled in the art will understand that the output load can be any size possibly requiring more or fewer stages of the exponential horn. For example, to drive a load of 256× requires a seven stage chain with the last stage having a size of 128×.

The exponential horn of FIG. 23 consumes significant power in its intermediate amplification stages and introduces considerable jitter into the final buffered clock due to delay modulation of the intermediate stages.

The present invention overcomes these problems with prior art clock amplifiers by using an injection locked oscillator to amplify a weak clock signal as shown in FIG. 24. A weak clock, clk, is coupled to a strong oscillator 205 via coupling 203. Because the coupling only needs to correct small phase errors in the oscillator 205, it can be many times smaller than the devices in the oscillator without concern for limiting bandwidth. A specific example of a clock buffer employing this technique is shown in FIG. 25. Here 1× inverter 313 weakly couples the input clock into an injection locked ring oscillator formed by three 32× inverters 315a through 315c. The free running frequency of the ring oscillator is set to be identical to clk via the control voltage vctrl which is generated by a (possibly smaller) replica oscillator. The weak coupling from inverter 313 then locks the phase of the coupled oscillator to the phase of input clock, clk. The result is an output signal, bclk, with 32× drive strength with only a single inverter delay from input signal clk. One skilled in the art will understand that this method can be applied to different ratios of input to output drive strength by using different strengths of coupling or by using a small exponential horn before the coupling.

Clock Interpolation Using an Injection Locked Oscillator

Another application of the injection-locked oscillator described above is as a clock interpolator (or digitally-controlled phase shifter). In many timing systems it is necessary to generate a clock with a phase controlled by a digital signal. For example, a six-bit digital control signal may select the phase of the output clock. A control value of 0 selects a phase of 0 degrees, a control value of 1 selects a phase of 360/64=5.6 degrees, a control value of 2 selects 11.2 degrees and so on.

Phase interpolators are conventionally constructed by selecting two phases of a multi-phase clock and interpolating between them. Conventional approaches to building a digitally-controlled phase shifter are described in "Digital Systems Engineering," by Dally and Poulton, Cambridge, 1998, pp. 636 to 641. Such conventional clock interpolators or phase shifters consume considerable power and introduce considerable jitter into the generated clock signal. The fundamental difficulty in designing these circuits for very high frequency clocks is that there is very little excess bandwidth available for performing functions such as multiplexing and interpolation. Hence these circuits require many stages, much like the exponential horn of FIG. 23.

Figure 26:
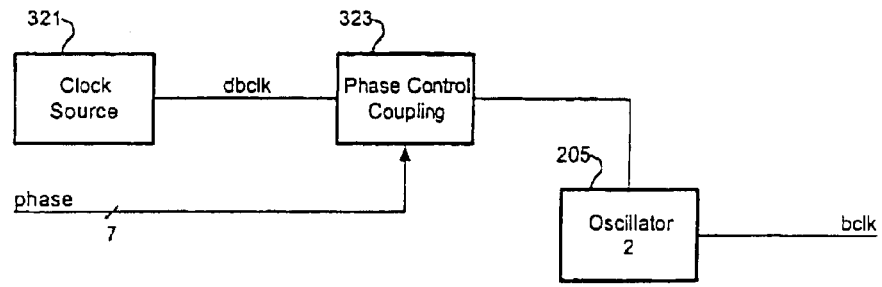
FIG. 26 illustrates use of the present invention in phase interpolation.

A phase interpolator using an injection locked oscillator is shown in FIG. 26. Here a clock source 321 generates a single-phase clock, dbclk. This clock is input to a phase controlled coupling 323 that accepts a digital phase control signal, phase, and couples dbclock to oscillator 205 under control of this signal. The coupling is performed so that at lock the phase of the output clock, bclk, is offset from the phase of the input clock, dbclk, by an amount determined by N, the value of phase, interpreted as a binary unsigned number.

Figure 27:
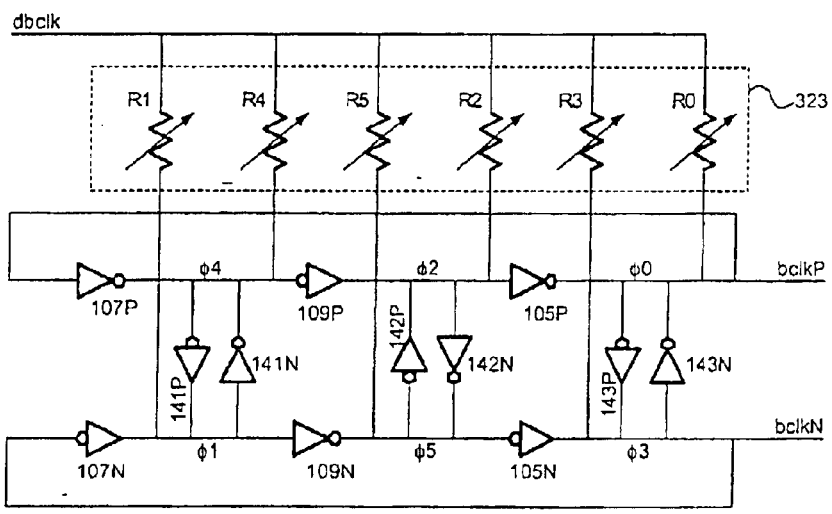
FIG. 27 illustrates a specific implementation of a phase interpolator.

FIG. 27 shows the details of one form of the phase controlled coupling. Here input clock signal dbclk is coupled to all six nodes of a differential ring oscillator (identical to the one in FIG. 14) by variable resistors. The free-running frequency of the ring oscillator is set by a control voltage (not shown) generated by a replica circuit to be within a small tolerance of the frequency of the incoming clock dbclk. At any point in time either one or two of the resistors are on, coupling dbclk to one or two points of the oscillator circuit, and the remaining resistors are off decoupling dbclk. In one embodiment, the 7-bit control signal is divided into a 3 bit coarse adjustment A that selects one of the six major phases (the other two encodings of this field are unused) and a 4-bit fine adjustment C that selects sixteen steps between each major phase. Thus, there are 6×16=96 phase settings spaced by 360/96=3.75 degrees.

As shown in FIG. 27, the differential ring oscillator produces six signals $\phi 0-\phi 5$ displaced by 360°/6=60° phase increments alternating top to bottom through the oscillator circuit. Corresponding resistors R0–R5 couple the dbclk to the individual phase signals.

When the phase signal has the value A.0, that is the coarse bits select phase A and the fine bits are zero, then exactly one resistor, RA, is on and that resistor is fully on. This gives a coupling that brings phase A into phase with dbclk, or alternatively makes phase 0 lead dbclk by 60A degrees. For example, if the setting is 2.0, R2 is fully on and the phase of the injection-locked oscillator is set so that phase $\phi 2$ is aligned with dbclk and phase 0 is 120 degrees behind dbclk. When dbclk and $\phi 2$ are aligned, no current will flow through the fully on resistor R2. However, if the signal should fall out of alignment, current will flow to either speed up or slow down the oscillating signals to bring dbclk and $\phi 2$ into alignment.

The fine adjustment field of the digital phase control signal interpolates between two of these major phase settings by varying the strength of two resistors. When the phase signal has the value A.C, that is the coarse bits select phase A and the fine bits select the position C/16 of the way from phase A to phase B where B=A+1 (mod 6), two resistors are on. Resistor RA is on with a strength (conductance) of (16−C)/16 and resistor RB is on with a strength of C/16. This gives a coupling that pulls the phase of the injection locked oscillator so that dbclk is C/16 of the way between phase A and phase B. For example if the setting is 1.3, the phase of the oscillator is adjusted so that the phase of dbclk is 3/16 of the way between phase 1 and phase 2. This is equivalent to being 11.25 degrees after phase 1 or 71.25 degrees after phase 0.

The variable resistors, really variable strength couplers, R0 through R5 can be realized in a number of different ways. In one embodiment, each resistor is a single NFET. To turn the resistor off, the gate of the NFET is driven low. To turn the NFET on to a particular setting, the gate of the NFET is driven to a voltage level corresponding to that setting. One skilled in the art will understand that PFETs or complementary transmission gates may be substituted for the NFET. In an alternative embodiment, each of the variable resistors is realized by a segmented FET or transmission gate (as described in Dally and Poulton, pp. 203–204 and pp. 517–519). This gives an arrangement with strictly digital control. Alternatively segmented inverters or gates or active circuits can be used as the variable strength coupling. The resistors can also be realized as resistors in series with FETs to switch them on and off. Any coupling circuit can be used as long as its coupling can be turned completely off and adjusted in discrete steps from a minimum value to a maximum value.

Figure 44:
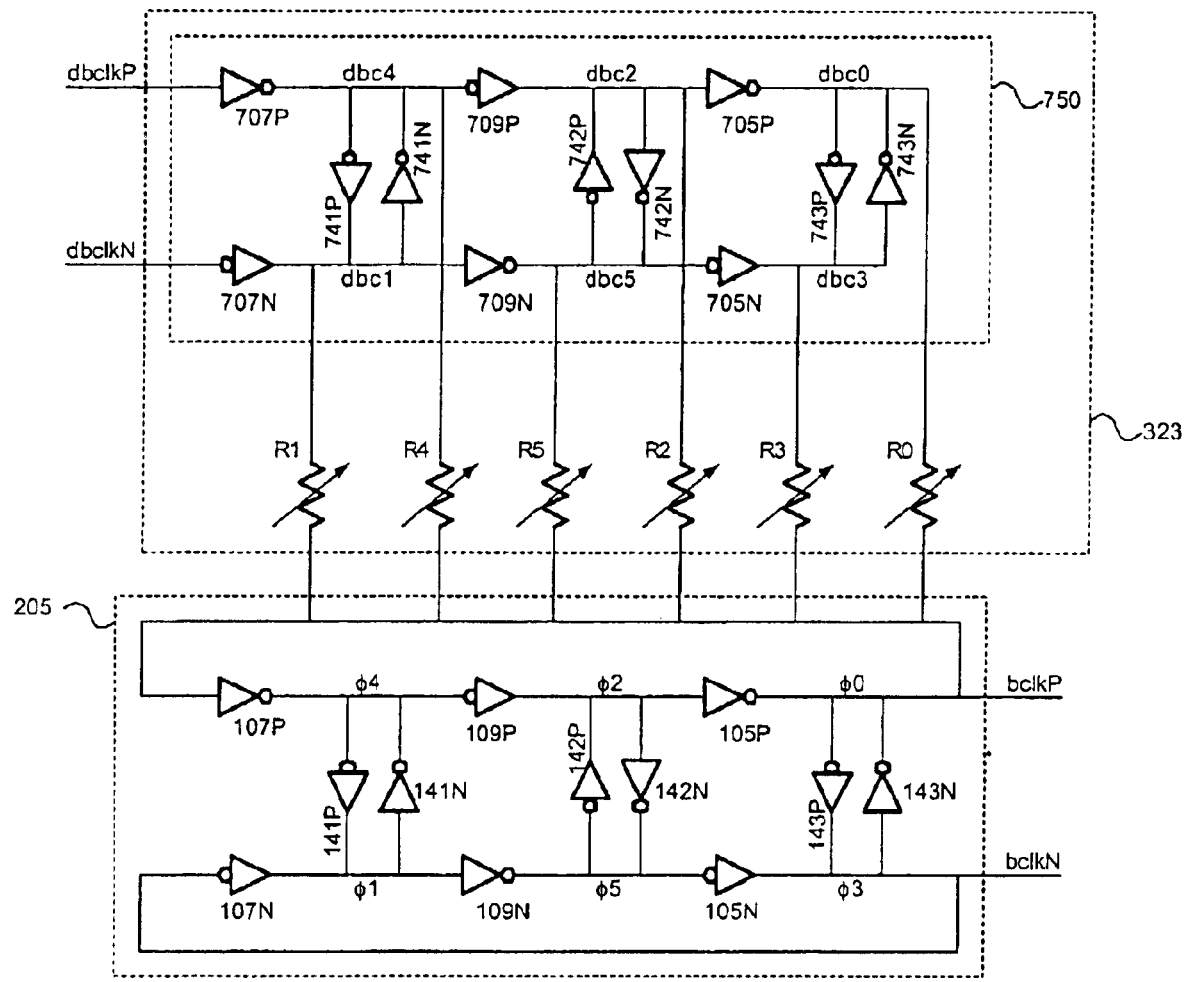
FIG. 44 illustrates another embodiment of the injection locked phase interpolator in which multiple phases of the input clock are coupled into a single phase of the oscillator.
Figure 45:
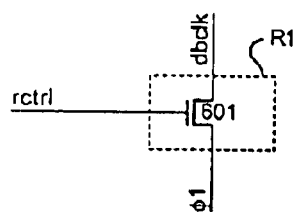
FIGS. 45 through 48 illustrate various embodiments of the variable strength resistors used in the interpolators of FIGS. 27 and 44.

FIGS. 45 through 48 show four possible implementations of the variable strength resistors, R0 through R7 used in the injection-locked interpolators of FIGS. 27 and 44. FIG. 45 shows a resistor, R1, implemented as a single NFET 601 with an analog control voltage. To turn the resistor off, its gate signal, rctrl, is driven low. To turn the resistor on, rctrl is driven to a positive voltage and the magnitude of the voltage determines the value of the resistance. In the preferred embodiment, a pair of digital-to-analog converters (DACs) generates the gate voltage, rctrl, of the resistors corresponding to the two phases being interpolated.

Figure 46:
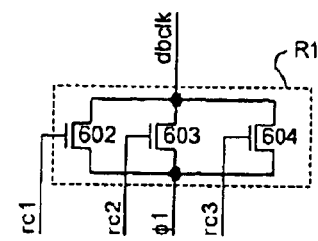

In an alternative embodiment, the resistors R0 through R7 are implemented as segmented NFETs that are controlled digitally, eliminating the need for DACs, as illustrated in FIG. 46. FIG. 46 shows a resistor R1 implemented as three NFETs 602, 603, and 604. The NFETs are sized so that NFET 603 is twice the width as NFET 602, and NFET 604 is twice the width of NFET 603. The three NFETs are controlled with digital control lines rc1, rc2, and rc3. To turn the resistor off, all three control lines are driven low. To turn the resistor on, the three control lines are set to the binary encoding of the conductance (the reciprocal of resistance) desired. One skilled in the art will understand that this digitally-controlled variable resistor can be implemented with a different number of NFET segments and the segments may be sized in a manner other than by powers of two (e.g., geometrically sized or identically sized).

Figure 47:
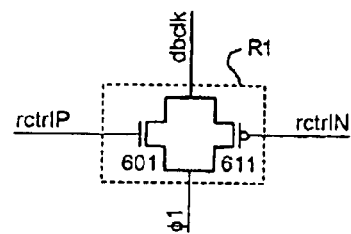

In yet another alternate embodiment, shown in FIG. 47, each variable resistor is realized as a complementary transmission gate, consisting of NFET 601 and PFET 611, controlled by a pair of complementary analog control voltages. This variable resistor operates identically to the NFET only resistor of FIG. 45 except that PFET 611 with complementary control voltage rctrlN operates in parallel with NFET 601. This results in a more linear resistance and a wider range of operating voltage. Control voltages rctrlN and rctrlP operate in opposite directions. To turn the resistor off, rctrlP is set low (equal to GND) and rctrlN is set high (equal to the positive supply, Vdd). To turn the resistor on to a certain value, rctrlP is set to a value X, and rctrlN is set to the value Vdd-X.

Figure 48:
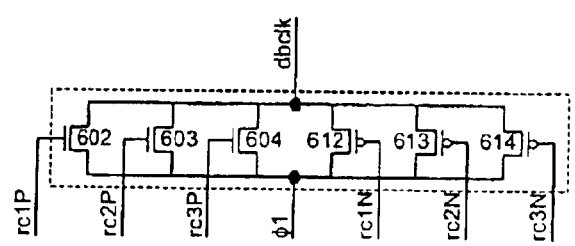

FIG. 48 shows a complementary version of the digitally controlled variable resistor. Here binary weighted NFETs 602–604 are controlled by digital signals rc1P–rc3P and binary weighted PFETs 612–614 are controlled by complementary digital signals rc1N–rc3N.

One skilled in the art will also understand that the injection-locked phase shifter can be realized using an oscillator with any number of phases greater than or equal to three. The example of FIG. 27 uses a six-phase oscillator. A second preferred embodiment uses a four phase oscillator where each major phase represents 90 degrees. This oscillator uses two bits of the control signal for coarse phase selection and five bits for fine phase selection.

One skilled in the art will also understand that while the example of FIG. 27 couples a single phase of the input clock into multiple phases of the oscillator, the same effect can be achieved in reverse by coupling multiple phases of the input clock into a single phase of the oscillator as described below with respect to FIG. 44. Also, in either direction, coupling need not be to all of the phases of either the oscillator or the input clock as long as digitally controlled coupling is provided to at least three phases with no more than 180 degrees between phases, phase shifting around the entire unit circle will be possible. Hybrid arrangements are also possible where multiple phases of the input clock are coupled to multiple phases of the oscillator.

The interpolator could also be applied to a multiplier circuit. For example, in the multiplier of FIG. 19, the coupler 203 would have multiple connections to the oscillator 205 as shown in FIG. 27.

FIG. 44 shows an alternate embodiment of the injection-locked clock interpolator of FIG. 26 in which multiple phases of the input clock are selectively coupled into a single phase of the oscillator. The differential input clock, dbclkP, dbclkN is fed to a tapped delay line 750 to generate multiple input clock phases, dbc0 through dbc5. Each of these input clock phases is then coupled to phase zero (φ0) of oscillator 205 via a variable resistor. Input clock phase dbc0 is coupled to oscillator phase zero via R0, input phase dbc1 is coupled via R1, and so on.

In operation, at most two resistors are 'on' at a time. The remainder are 'off' and thus act as open circuits. When a single resistor is on, say R1, it couples one phase of the input clock, in this case dbc1, to oscillator phase zero. This coupling causes oscillator phase zero to become aligned with input clock phase dbc1. In this manner, the output clock, bclk, can be aligned with any of the six phases of the input clock. To set the output clock to a point intermediate between two input clock phases, two resistors are activated and the relative strength of their activation determines the phase of the output clock. For example, to set the output phase exactly half way between input clock phases 1 and 2, resistors R1 and R2 are set to identical values. This causes oscillator phase zero to align to a point midway between these two input phases. To move a small step toward phase dbc2, the resistance of resistor R1 is increased and/or the resistance of R2 is decreased. In this manner the phase can be set at an arbitrary position around the unit circle. In the preferred embodiment, the phase adjustment is divided into a four-bit coarse adjustment that selects the major phase (0 through 5) and a 4-bit fine adjustment that selects the fractional phase step. One skilled in the art will understand that the invention can be practiced with different numbers of major phases, different numbers of steps between phases, and different phase encoding methods (e.g., one-hot). As described above, the coarse bits select a pair of resistors to be turned on, and the fine bits determine the value of the variable resistors.

In this embodiment, coupler 323 of FIG. 26 consists of differential tapped delay line 750 and variable resistors R0 through R7. The differential tapped delay line in this case is implemented with inverters 705P, 705N, 707P, 707N, 709P, 709N. Cross coupling (inverters 741P, 741N, 742P, 742N, 743P, 743N) is used on the output of each of the three stages to maintain alignment between the two polarities. Oscillator 205 of FIG. 26 in this embodiment is implemented as a differential inverter ring oscillator, identical to that used in FIG. 27. In the preferred embodiment the control voltage used as the supply of oscillator 205 to set its operating frequency is also used as the supply of delay line 750 so that the spacing between the input clock phases matches the spacing of the oscillator phases.

Coupling to the Injection-Locked Oscillator

All of the applications of injection-locked oscillators described above use couplers to couple a periodic input clock signal into an injection-locked oscillator that generates a periodic output clock signal. For applications where the input clock and output clock are the same frequency, the coupling may be continuous and can take many forms including resistors (fixed or variable) as shown in FIG. 27, inverters as shown in FIG. 25, or FETs as shown in FIGS. 14 and 15. For applications, such as the clock multiplier, where the input clock and the output clock have different rates, the coupling is preferably gated so it is active only during a short period of time, comparable to a half period of the output clock, after each active edge of the input clock. The FETs of FIGS. 14 and 15 are an example of such a gated coupling.

Figure 28:
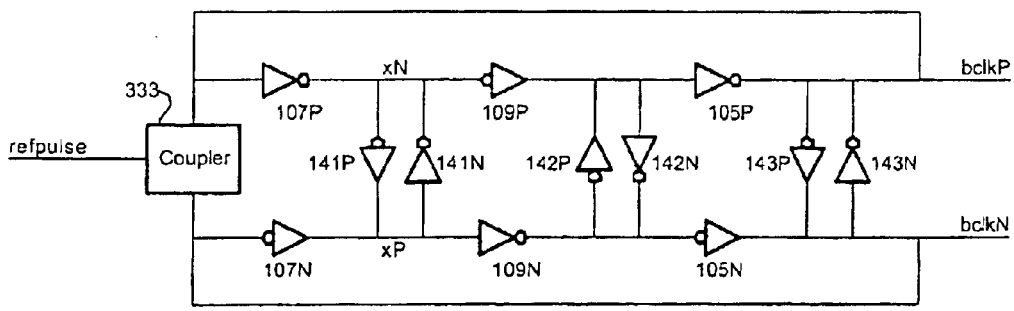
FIG. 28 illustrates a differential ring oscillator in which coupling is by means of a conductance between phases of the oscillator.

When a differential ring oscillator is employed as the injection locked oscillator, gated coupling can also be performed by gating a resistive connection between the two polarities of the oscillator. The basic arrangement is shown in FIG. 28. When signal refpulse (which serves the same function as signal gate in FIG. 1) is asserted, coupler 333 inserts a conductance between bclkP and bclkN. As described below, this conductance acts to adjust the phase of the oscillator so that the crossover point of blkcP and bclkN is centered on the middle of the pulse on refpulse. The timing with the system in lock is shown in FIG. 32 and zoomed in in FIG. 33.

The differential coupler 333 can be implemented in several ways as illustrated in FIGS. 29 through 31. The simplest implementation, shown in FIG. 29, consists of a single NFET. When signal refpulse is asserted, the NFET turns on providing a conductance between bclkP and bclkN. To avoid having to generate a narrow pulse on signal refpulse, two NFETs can be used as shown in FIG. 30. Here two signals refopen and refclose are used in place of a narrow refpulse. The conductance is applied from the rising edge of refopen until the falling edge of refclose. The timing of the system using refopen and refclose in place of refpulse is illustrated in FIG. 34. Finally, CMOS transmission gates can be used in place of the NFETs as shown in FIG. 31.

To see how applying a pulse of conductance between bclkP and bclkN pulls the phase of the oscillator into alignment, consider FIGS. 35 and 36. FIG. 35 shows the situation where the oscillator is slow—refclk leads the crossover of bclkP and bclkN. In this case, most of the conductance is applied before the crossover of bclkP and bclkN. This conductance acts to pull the two clock polarities together, accelerating their transition and hence speeding up the clock and pulling it into phase.

Similarly, FIG. 36 illustrates the case where the oscillator is fast. In this case refclk lags the crossover of bclkP and bclkN. Again the pulse of conductance acts to pull the two clock polarities together, but this time, since the conductance is applied after the crossover, pulling the clocks together slows their transition and in turn slows the oscillator. The net result is again to pull the phase of the oscillator into alignment with the pulse.

While this invention has been particularly shown and described with references to preferred embodiments thereof, it will be understood by those skilled in the art that various changes in form and details may be made therein without departing from the scope of the invention encompassed by the appended claims.

What is claimed is:

1. An oscillator circuit comprising:
   an oscillator having a resonant frequency;
   an input signal having a frequency about equal to or less than the resonant frequency and having a phase; and
   a coupler which couples the input signal with an oscillating signal in the oscillator to filter pulse width variations of the input signal.

2. An oscillator circuit as claimed in claim 1 wherein the resonant frequency is about equal to an integer multiple of the frequency of the input signal.

3. An oscillator circuit as claimed in claim 2 wherein the input signal has a pulse duration less than or equal to a pulse duration of the oscillating signal.

4. An oscillator circuit as claimed in claim 3 wherein the oscillating signal is gated by the input signal to stop the oscillator.

5. An oscillator circuit as claimed in claim 3 wherein the input signal comprises a reference clock and a delayed version of the reference clock.

6. An oscillator circuit as claimed in claim 3 further comprising a pulse generator which generates the input signal from a reference clock.

7. An oscillator circuit as claimed in claim 3 wherein each active edge of the input signal moves the phase of the oscillating signal only part of the distance needed to align it with the input signal.

8. An oscillator circuit as claimed in claim 1 wherein the frequency of the input signal is about equal to the resonant frequency.

9. An oscillator circuit as claimed in claim 8 in combination with an input oscillator which generates the input signal from a reference clock, the oscillator circuit filtering jitter from the reference clock.

10. An oscillator circuit as claimed in claim 8 wherein the coupler provides a filtering time constant which is greater than a cycle time of the input signal.

11. An oscillator circuit as claimed in claim 8 wherein the oscillator amplifies the input signal.

12. An oscillator circuit as claimed in claim 1 wherein a free running frequency of the oscillator is controlled by a reference delay.

13. An oscillator circuit as claimed in claim 1 wherein a free running frequency of the oscillator is controlled by a phase comparator.

14. An oscillator circuit as claimed in claim 1 wherein a free running frequency of the oscillator is controlled by a replica oscillator.

15. An oscillator circuit as claimed in claim 14 wherein the replica oscillator is controlled by a phase locked loop.

16. An oscillator circuit as claimed in claim 14 wherein the replica oscillator is controlled by a delay locked loop.

17. An oscillator circuit as claimed in claim 1 wherein the oscillator is a ring oscillator.

18. An oscillator circuit as claimed in claim 17 wherein the ring oscillator is a differential oscillator.

19. An oscillator circuit as claimed in claim 17 wherein the ring oscillator comprises inverter delay elements.

20. An oscillator circuit as claimed in claim 18 wherein the coupler comprises a partial NAND gate.

21. An oscillator circuit as claimed in claim 18 wherein the coupler comprises a partial NOR gate.

22. An oscillator circuit as claimed in claim 18 wherein the ring oscillator comprises three stages.

23. An oscillator circuit as claimed in claim 18 wherein the ring oscillator comprises two stages.

24. An oscillator circuit as claimed in claim 18 wherein the coupler comprises a conductance between phases of the ring oscillator.

25. An oscillator circuit as claimed in claim 24 wherein the conductance comprises an FET.

26. An oscillator circuit as claimed in claim 24 wherein the conductance comprises a transmission gate.

27. An oscillator circuit as claimed in claim 18 wherein the ring oscillator comprises source coupled stages.

28. An oscillator circuit as claimed in claim 1 wherein the oscillator is an LC oscillator.

29. An oscillator circuit as claimed in claim 1 wherein the coupler comprises an inverter.

30. An oscillator circuit as claimed in claim 1 wherein the coupler comprises a resistor.

31. A method of providing an oscillating signal comprising:

generating the oscillating signal in an oscillator, the oscillator having a resonant frequency; and coupling an input signal, having a frequency about equal to or less than the resonant frequency and having a phase, with an oscillating signal in the oscillator to filter pulse width variations of the input signal.

32. A method as claimed in claim 31 wherein the resonant frequency is about equal to an integer multiple of the frequency of the input signal.

33. A method as claimed in claim 32 wherein the input signal has a pulse duration less than or equal to a pulse duration of the oscillating signal.

34. A method as claimed in claim 33 wherein the oscillating signal is gated by the input signal to stop the oscillator.

35. A method as claimed in claim 33 wherein each active edge of the input signal moves the phase of the oscillating signal only part of the distance needed to align it with the input signal.

36. A method as claimed in claim 31 wherein the frequency of the input signal is about equal to the resonant frequency.

37. A method as claimed in claim 36 further comprising generating the input signal in an input oscillator from a reference clock, the oscillator filtering jitter from the reference clock.

38. A method as claimed in claim 36 wherein the coupler provides a filtering time constant which is greater than a cycle time of the input signal.

39. A method as claimed in claim 36 wherein the oscillator amplifies the input signal.

40. A method as claimed in claim 36 wherein the oscillator is an LC oscillator.

41. An oscillator circuit comprising:

oscillator means having a resonant frequency;

an input signal having a frequency about equal to or less than the resonant frequency and having a phase; and coupler means which couples the input signal with an oscillating signal in the oscillating means to filter pulse width variations of the input signal.

42. An oscillator circuit comprising:

a ring oscillator having a resonant frequency;

an input signal having a frequency about equal to or less than the resonant frequency and having a phase; and a coupler which couples the input signal with an oscillating signal in the ring oscillator to cause a phase shift of the oscillating signal towards the phase of the input signal where each active edge of the input signal moves the phase of the oscillating signal to align the oscillating signal with the input signal.

43. An oscillator circuit as claimed in claim 42 wherein the resonant frequency is about equal to an integer multiple of the frequency of the input signal.

44. An oscillator circuit as claimed in claim 43 wherein the input signal has a pulse duration less than or equal to a pulse duration of the oscillating signal.

45. An oscillator circuit as claimed in claim 44 wherein the oscillating signal is gated by the input signal to stop the oscillator.

46. An oscillator circuit as claimed in claim 44 wherein each active edge of the input signal moves the phase of the oscillating signal only part of the distance needed to align it with the input signal.

47. An oscillator circuit as claimed in claim 44 wherein the input signal comprises a reference clock and a delayed version of the reference clock.

48. An oscillator circuit as claimed in claim 44 further comprising a pulse generator which generates the input signal from a reference clock.

49. An oscillator circuit as claimed in claim 42 wherein the frequency of the input signal is about equal to the resonant frequency.

50. An oscillator circuit as claimed in claim 49 wherein the ring oscillator filters the input signal.

51. An oscillator circuit as claimed in claim 50 wherein the ring oscillator filters pulse width variations of the input signal.

52. An oscillator circuit as claimed in claim 50 in combination with an input oscillator which generates the input signal from a reference clock, the ring oscillator circuit filtering jitter from the reference clock.

53. An oscillator circuit as claimed in claim 50 wherein the coupler provides a filtering time constant which is greater than a cycle time of the input signal.

54. An oscillator circuit as claimed in claim 50 wherein the ring oscillator amplifies the input signal.

55. An oscillator circuit as claimed in claim 42 wherein the ring oscillator is a differential oscillator.

56. An oscillator circuit as claimed in claim 55 wherein the ring oscillator comprises inverter delay elements.

57. An oscillator circuit as claimed in claim 55 wherein the coupler comprises a partial NAND gate.

58. An oscillator circuit as claimed in claim 55 wherein the coupler comprises a partial NOR gate.

59. An oscillator circuit as claimed in claim 55 wherein the ring oscillator comprises three stages.

60. An oscillator circuit as claimed in claim 55 wherein the ring oscillator comprises two stages.

61. An oscillator circuit as claimed in claim 55 wherein the coupler comprises a conductance between phases of the ring oscillator.

62. An oscillator circuit as claimed in claim 61 wherein the conductance comprises an FET.

63. An oscillator circuit as claimed in claim 61 wherein the conductance comprises a transmission gate.

64. An oscillator circuit as claimed in claim 55 wherein the ring oscillator comprises source coupled stages.

65. A method of providing an oscillating signal comprising:

generating the oscillating signal in a ring oscillator, the ring oscillator having a resonant frequency; and coupling an input signal, having a frequency about equal to or less than the resonant frequency and having a phase, with an oscillating signal in the ring oscillator to cause a phase shift of the oscillating signal towards the phase of the input signal where each active edge of the input signal moves the phase of the oscillating signal to align the oscillating signal with the input signal.

66. An oscillator circuit comprising:

ring oscillator means having a resonant frequency;

an input signal having a frequency about equal to or less than the resonant frequency and having a phase; and coupler means which couples the input signal with an oscillating signal in the ring oscillating means to cause a phase shift of the oscillating signal toward the phase of the input signal where each active edge of the input signal moves the phase of he oscillating signal to align the oscillating signal with the input signal.

67. An oscillator circuit comprising:

an oscillator having a resonant frequency;

an input signal having a frequency about equal to or less than the resonant frequency and having a phase; and a coupler which couples the input signal with an oscillating signal in the oscillator, and at each cycle, the oscillating signal being gated by the input signal.

68. An oscillator circuit as claimed in claim 67 wherein the resonant frequency is about equal to an integer multiple of the frequency of the input signal.

69. An oscillator circuit as claimed in claim 68 wherein the input signal has a pulse duration less than or equal to a pulse duration of the oscillating signal.

70. An oscillator circuit as claimed in claim 68 wherein the oscillating signal is gated by the input signal to stop the oscillator.

71. An oscillator circuit as claimed in claim 68 comprising a pulse generator which generates the input signal from a reference clock.

72. An oscillator circuit as claimed in claim 68 wherein the oscillator amplifies the input signal.

73. An oscillator circuit as claimed in claim 68 wherein the input signal comprises a reference clock and a delayed version of the reference clock.

74. An oscillator circuit comprising:

an oscillator having a resonant frequency;

an input signal having a frequency about equal to or less than the resonant frequency and having a phase; and a coupler which couples the input signal with an oscillating signal in the oscillator, the oscillating signal being gated by the input signal, where the input signal comprises a reference clock and a delayed version of the reference clock.

75. An oscillator circuit as claimed in claim 74 wherein the resonant frequency is about equal to an integer multiple of the frequency of the input signal.

76. An oscillator circuit as claimed in claim 75 wherein the input signal has a pulse duration less than or equal to a pulse duration of the oscillating signal.

77. An oscillator circuit as claimed in claim 75 wherein the oscillating signal is gated by the input signal to stop the oscillator.

78. An oscillator circuit as claimed in claim 75 further comprising a pulse generator which generates the input signal from a reference clock.

79. An oscillator circuit as claimed in claim 75 wherein the oscillator amplifies the input signal.

80. A method of providing an oscillating signal comprising:

generating the oscillating signal in an oscillator, the oscillator having a resonant frequency; and coupling an input signal, having a frequency about equal to or less than the resonant frequency and having a phase, with an oscillating signal in the oscillator, and for each cycle, gating, by the input signal, the oscillating signal.

81. An oscillator circuit comprising:

oscillator means having a resonant frequency;

an input signal having a frequency about equal to or less than the resonant frequency and having a phase; and coupler means which couples the input signal to an oscillating signal in the oscillating means, and for each cycle, the oscillating signal being gated by the input signal.

82. An oscillator circuit comprising:

an oscillator having a resonant frequency;

an input signal having a frequency about equal to or less than the resonant frequency and having a phase;

a pulse generator which generates an input signal from a reference clock; and a coupler which couples the input signal with an oscillating signal, the input signal having a pulse duration less than or equal to a pulse duration of the oscillating signal.

83. An oscillator circuit as claimed in claim 82 wherein the resonant frequency is about equal to an integer multiple of the frequency of the input signal.

84. An oscillator circuit as claimed in claim 83 wherein the oscillating signal is gated by the input signal to stop the oscillator.

85. An oscillator circuit as claimed in claim 83 wherein the input signal comprises a reference clock and a delayed version of the reference clock.

86. An oscillator circuit as claimed in claim 83 wherein each active edge of the input signal moves the phase of the oscillating signal only part of the distance needed to align it with the input signal.

87. An oscillator circuit as claimed in claim 82 wherein the frequency of the input signal is about equal to the resonant frequency.

88. An oscillator circuit as claimed in claim 87 wherein the oscillator filters the input signal.

89. An oscillator circuit as claimed in claim 88 wherein the oscillator filters pulse width variations of the input signal.

90. An oscillator circuit as claimed in claim 88 in combination with an input oscillator which generates the input signal from a reference clock, the oscillator circuit filtering jitter from the reference clock.

91. An oscillator circuit as claimed in claim 88 wherein the coupler provides a filtering time constant which is greater than a cycle time of the input signal.

92. An oscillator circuit as claimed in claim 88 wherein the oscillator amplifies the input signal.

93. A method of providing an oscillating signal comprising:

generating the oscillating signal in an oscillator, the oscillator having a resonant frequency;

a pulse generator which generates an input signal from a reference clock; and coupling an input signal, having a frequency about equal to or less than the resonant frequency and having a phase, with an oscillating signal in the oscillator, the input signal having a pulse duration less than or equal to a pulse duration of the oscillating signal.

94. An oscillator circuit comprising:

oscillator means having a resonant frequency;

an input signal having a frequency about equal to or less than the resonant frequency and having a phase;

a pulse generator which generates an input signal from a reference clock; and coupler means which couples the input signal to an oscillating signal in the oscillating means, the input signal having a pulse duration less than or equal to a pulse duration of the oscillating signal.

* * * * *